United States Patent
Watanabe (10) Patent No.: US 6,621,297 B2
(45) Date of Patent: Sep. 16, 2003

(54) SEMICONDUCTOR DEVICE MALFUNCTION PREVENTIVE CIRCUIT

(75) Inventor: Takafumi Watanabe, Tokyo (JP)

(73) Assignee: Allied Telesis K.K. (JP)

( * ) Notice: Subject to any disclaimer, the term of this patent is extended or adjusted under 35 U.S.C. 154(b) by 0 days.

(21) Appl. No.: 10/137,707

(22) Filed: May 2, 2002

(65) Prior Publication Data

US 2003/0151444 A1 Aug. 14, 2003

(30) Foreign Application Priority Data

Feb. 13, 2002 (JP) .......................................... 2002-034741

(51) Int. Cl.[7] .............................................. H03K 19/177
(52) U.S. Cl. ................................ 326/41; 326/40; 326/26
(58) Field of Search ...................................... 327/310, 379, 327/383, 384, 557; 326/26, 27, 21, 40, 41

(56) References Cited

U.S. PATENT DOCUMENTS

| | | | |
|---|---|---|---|
| 5,059,836 A | * | 10/1991 | Lee et al. .................... 327/557 |
| 5,418,486 A | * | 5/1995 | Callahan ..................... 327/310 |
| 5,591,992 A | | 1/1997 | Leach ......................... 257/173 |

FOREIGN PATENT DOCUMENTS

| | | | |
|---|---|---|---|
| EP | 0 533 336 A1 | 3/1993 | ............ H02H/9/04 |
| JP | 5-235274 | 9/1993 | ............ H01L/27/04 |
| JP | 6-132485 | 5/1994 | ............ H01L/27/04 |

OTHER PUBLICATIONS

Patent Abstracts of Japan, Publication No. 05–235274, Publication Date Sep. 10, 1993, 2 pages.
Patent Abstracts of Japan, Publication No. 06–132485, Publication Date May 13, 1994, 2 pages.

* cited by examiner

Primary Examiner—Tuan T. Lam
Assistant Examiner—Hiep Nguyen
(74) Attorney, Agent, or Firm—Rosenthal & Osha L.L.P.

(57) ABSTRACT

A semiconductor device malfunction preventive circuit S is disposed in a macrocell logic cell 1 of a semiconductor device 50 used in an electronic device 100. A signal in an output pin 3 or in a signal line 6 is returned to the semiconductor device malfunction preventive circuit S as a pin feedback and monitored. When a predetermined state is detected, an abnormality detecting signal $SIG_{AB}$ for resetting the operation of the electronic device 100 is outputted.

10 Claims, 6 Drawing Sheets

SEMICONDUCTOR DEVICE MALFUNCTION PREVENTIVE CIRCUIT

BACKGROUND OF THE INVENTION

1. Field of the Invention

The present invention relates to a circuit for preventing or suppressing a malfunction of a semiconductor device due to an external noise, and particularly, to a semiconductor device malfunction preventive circuit which can be configured inside a semiconductor device.

2. Description of the Related Art

A semiconductor device is supported by a fine processing technique, and its manufacturing process has tended to become finer in recent years with the progress of a semiconductor manufacturing technique.

As the manufacturing process thus becomes finer, the pattern structure, arrangement, and so on of a semiconductor device are naturally made finer.

Meanwhile, as a semiconductor device is thus made finer, a malfunction of a semiconductor device due to an electrostatic pulse (ESD pulse) caused by electrostatic discharge shows an increasing tendency. Especially, it is generally known that an ESD pulse invading a semiconductor device reaches as high as the order of several kV in a short time as a semiconductor device is thus made finer.

A malfunction in a semiconductor device due to a so-called external noise such as electrostatic discharge as mentioned above will be explained here with reference to FIG. 3 to FIG. 6.

Figure 3:
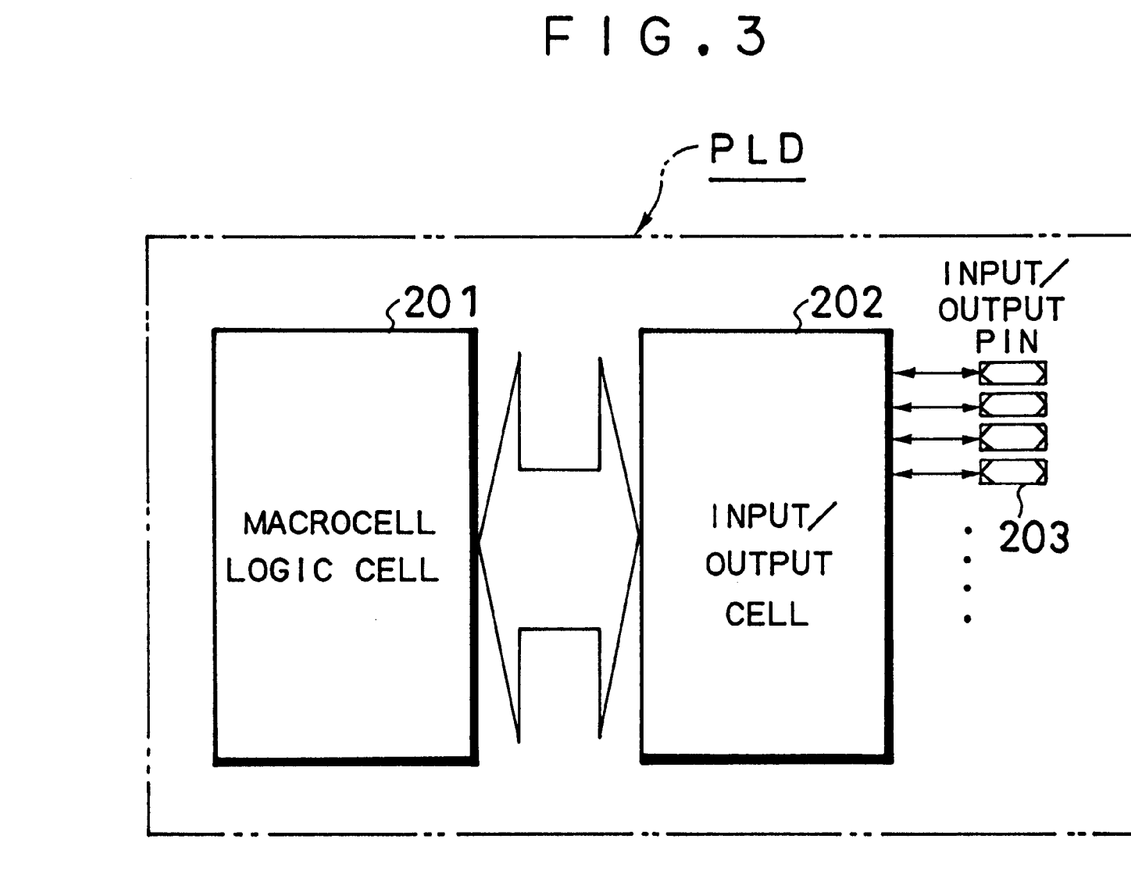
FIG. 3 is a block diagram showing a configuration example of a conventional PLD.

First, a configuration example of a conventionally and generally known so-called PLD (Programmable Logic Device) which is structured to allow a user to set a desired logic circuit therein is shown in FIG. 3 as one example of a semiconductor device.

This PLD is mainly composed of a section called a macrocell logic cell 201 which is structured to allow a desired logic circuit to be configured therein and a section called an input/output cell 202 for executing the distribution and so on of a signal generated in the macrocell logic cell 201 and a signal inputted to the macrocell logic cell 201 from an external part.

The PLD also includes a plurality of input/output pins 203 for outputting the signal generated in the macrocell logic cell 201 to the external part via the input/output cell 202 and inputting the signal to the macrocell logic cell 201 from the external part.

The PLD as described above is used in various electronic devices, systems, and so on, and it is generally thought that various external noises invade such electronic devices and so on as described below.

Figure 4:
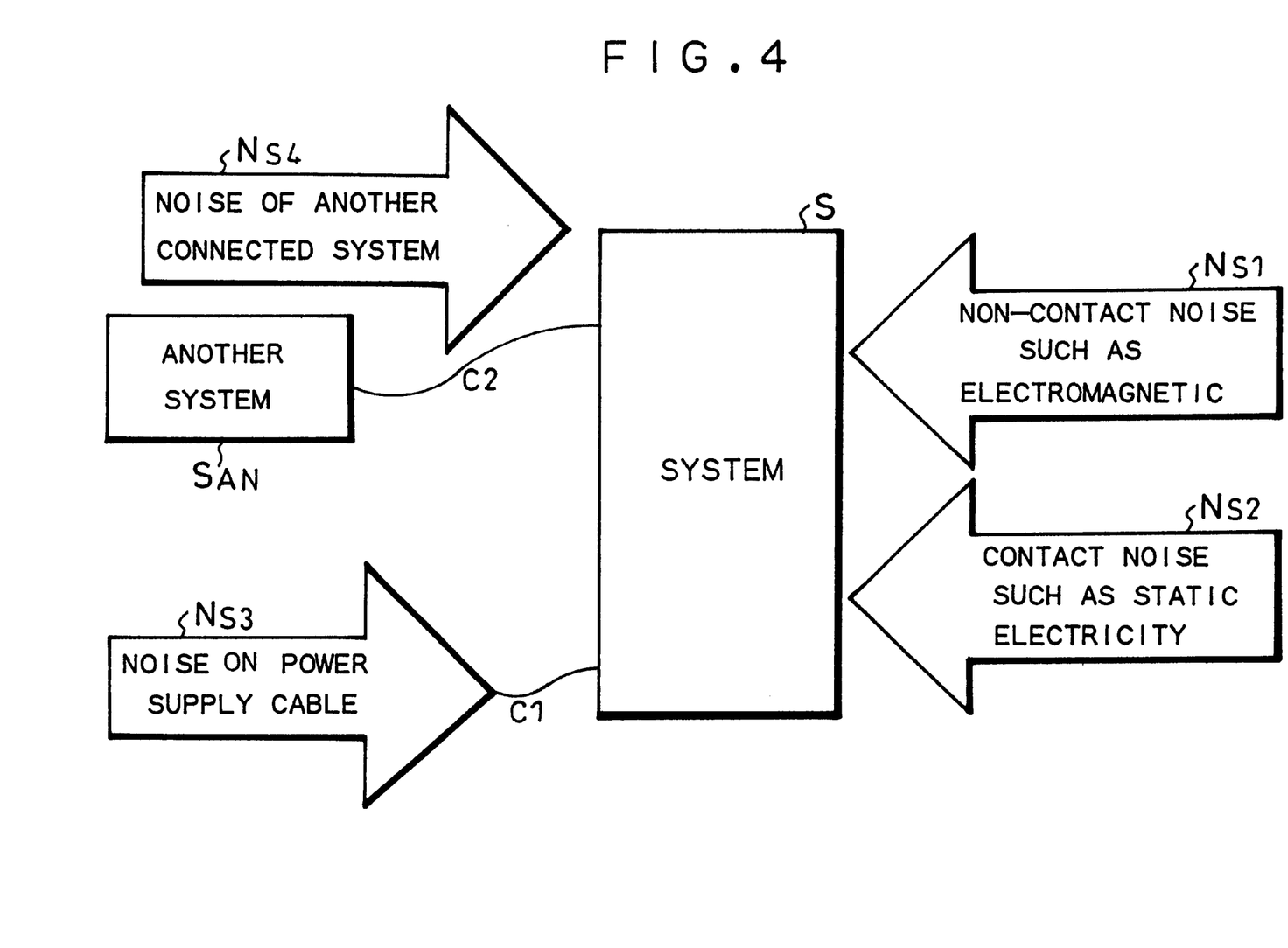
FIG. 4 is an explanatory view explaining the idea of external noises invading an electrical system.

Specifically, a so-called non-contact noise $N_{S1}$ such as an electromagnetic wave which directly invades various electrical systems S from space, not via a signal cable, a power supply cable, or the like, is first thought to exist, as shown in FIG. 4. Besides, there also exists a so-called contact noise $N_{S2}$ which occurs, for example, when static electricity stored in a body of a user or the like of the system S invades the system S due to ESD caused by the user's contact with the system S (sometimes without the user's contact).

There also exists a noise $N_{S3}$ invading the system S from a power supply (not shown) via a power supply cable C1 for supplying a power supply voltage to the system S.

There also exists a noise $N_{S4}$ invading the system S via a connecting cable C2 from another system $S_{AN}$ connected to the system S.

There is of course the possibility that the non-contact noise $N_{S1}$ such as an electromagnetic wave, an ESD pulse caused by ESD, and so on invade the not-shown power supply and the other system $S_{AN}$, and that these non-contact noise $N_{S1}$ and ESD pulse also invade the system S from the power supply and the other system $S_{AN}$ via the power supply cable C1 and the connecting cable C2.

Especially, the ESD pulse among these various external noises sometimes reaches as high as several kV in an instant, and therefore, is highly possible to give a fatal physical damage to the system S. A semiconductor device in recent years is often protected against ESD to minimize the physical damage. However, in view of the recent circumstances in which a demand for further protection against ESD has been increasing as the semiconductor device manufacturing process has become finer, it cannot be said that sufficient protection is given at present.

The malfunction of the PLD due to the ESD pulse will be explained here with reference to FIG. 5 and FIG. 6.

Figure 5:
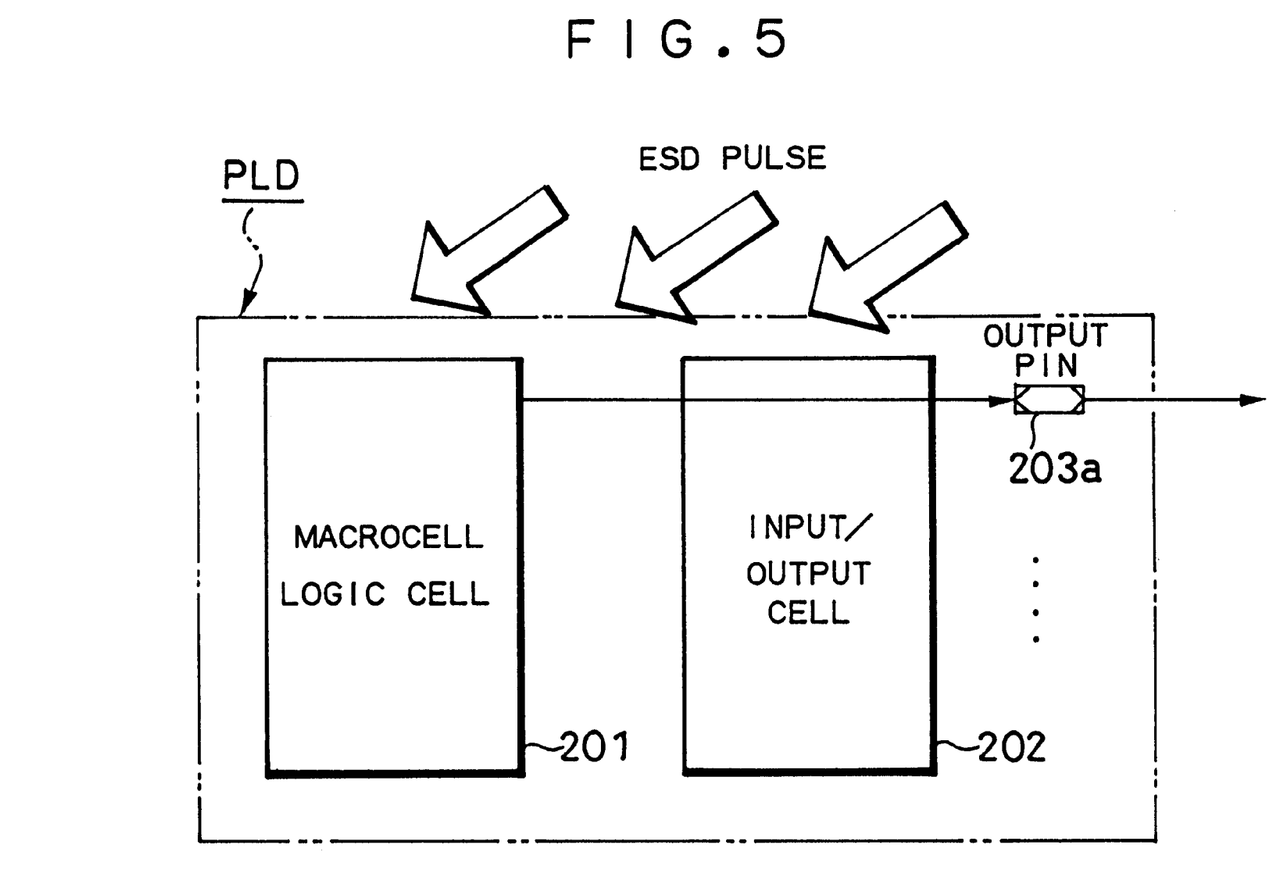
FIG. 5 is a schematic view schematically showing how an ESD pulse invades a PLD from an external part.

First, FIG. 5 schematically shows how the ESD pulse invades the PLD from the external part. In FIG. 5, it is assumed that a reset signal for resetting the operation of, for example, an electronic device, various systems, or the like in which this PLD is used and a control signal necessary for generating the reset signal are applied to an output pin 203a.

Figure 6:
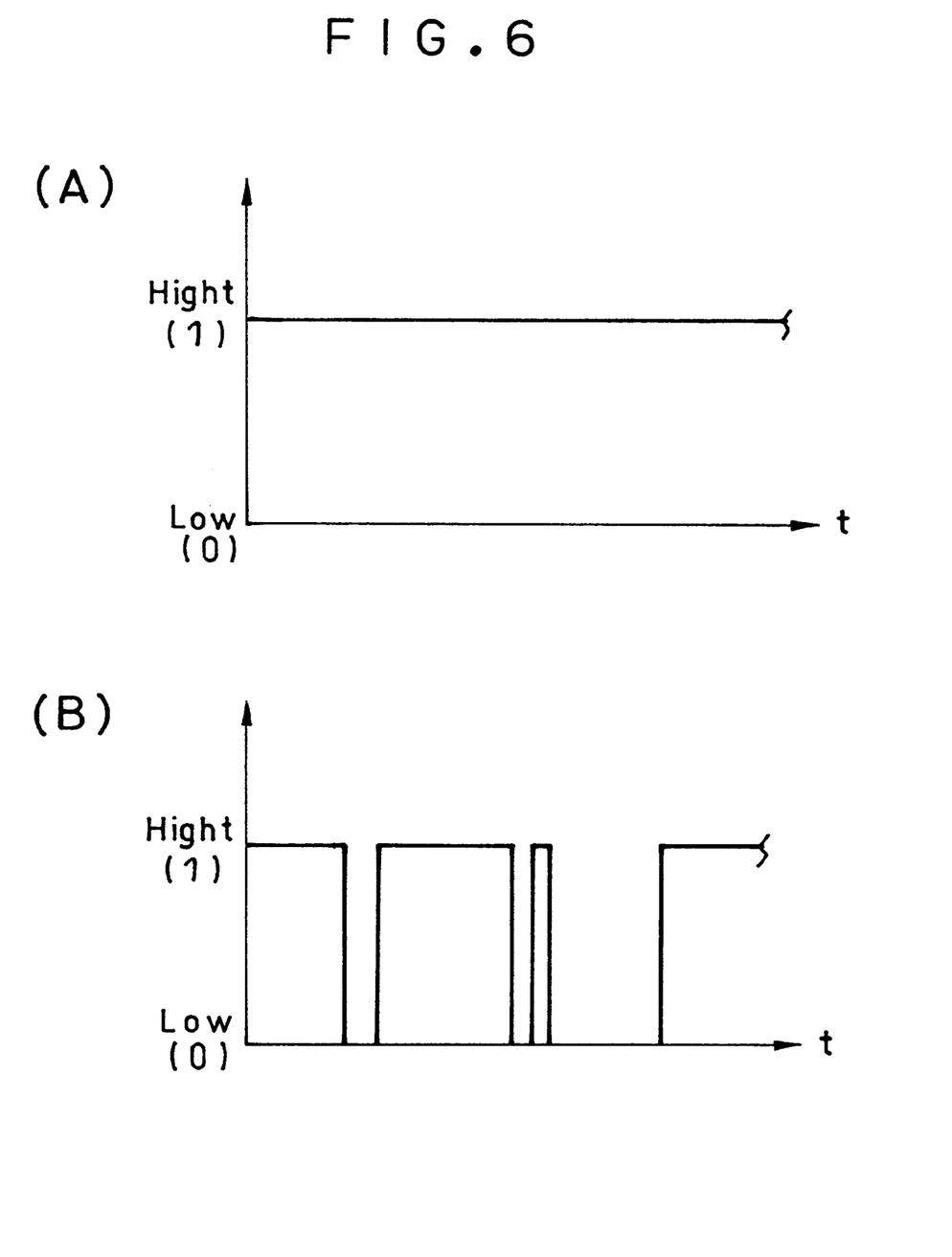
FIGS. 6(A) and 6(B) are waveform examples of an output signal, FIG. 6(A) being a waveform view showing the state of the output signal in its normal state, and FIG. 6(B) being a waveform view showing the state of the output signal when a malfunction occurs in the PLD due to an external noise, respectively.

It is also assumed that, when the signal outputted to this output pin 203a is a reset signal, this reset signal has a logical value of Low (0) at the time of resetting, and its output state is maintained at a logical value of High (1) in its normal state in which it does not execute the resetting operation (refer to FIG. 6 (A)).

On the above assumption, when the ESD pulse invades to cause a malfunction inside the macrocell logic cell 201 in the state when the signal with the logical value High is outputted from the output pin 203a, the output state of the output pin 203a in which the logical value should be High sometimes changes to the logical value Low at random, for example, as shown in FIG. 6(B).

The period of the logical value High, the period of the logical value Low, and so on are often strictly defined for the reset signal of an electronic device and so on and for a signal whose operation is equivalently important to the reset signal. Therefore, there is a concern that, since the state of the malfunction as described above does not allow normal resetting, the malfunction may give a fatal influence to the operation of the electronic device and so on, such as that they are brought into an uncontrollable state.

SUMMARY OF THE INVENTION

The present invention is made in view of the above-described circumstances, and it is an object of the present invention to provide a semiconductor device malfunction preventive circuit, a semiconductor device, and an electronic device which can suppress a malfunction in various electronic devices, systems, and so on due to an external noise and which can enhance operational reliability.

According to a first aspect of the present invention, provided is a semiconductor device malfunction preventive circuit which is disposed inside a semiconductor device, and which is so structured that a signal necessary for normalizing an operation of an electronic device using the semiconductor device is generated based on a monitoring result of a predetermined signal, to enable an improper output state of an output signal of the semiconductor device due to invasion of an external noise to be solved.

According to the above-described structure, the signal necessary for normalizing the operation of the electronic device is generated when necessary based on the monitoring result of the predetermined signal, and therefore, the semiconductor device malfunction preventive circuit which can prevent the electronic device from getting into an uncontrollable state is provided.

According to a second aspect of the present invention, provided is a semiconductor device malfunction preventive circuit which is disposed inside a semiconductor device, and which is so structured that a signal for forcibly resetting an operation of an electronic device using the semiconductor device is outputted based on a monitoring result of an output signal of the semiconductor device, to enable an improper output state of the output signal of the semiconductor device due to invasion of an external noise to be solved.

DETAILED DESCRIPTION OF THE PREFERRED EMBODIMENTS

The present invention will be hereinafter explained in detail with reference to the attached drawings.

An embodiment of the present invention will be explained below with reference to FIG. 1 and FIG. 2.

It is to be understood that the present invention is not intended to be limited to members, dispositions, and so forth which will be described below, and various modifications and improvements may be made therein without departing from the spirit of the present invention.

A configuration example when a semiconductor device malfunction preventive circuit S according to the embodiment of the present invention is used in an electronic device 100 will be first explained with reference to FIG. 1.

First, an electronic device with an interconnecting function represented by a hub, a router, a switch, and so on which are used, for example, in a computer network (for example, LAN and the like), namely, a so-called network device, is a specific example of the electronic device 100. Of course, the electronic device 100 is not necessarily limited to such a network device, and may be any electronic device as long as it uses a semiconductor device provided with the semiconductor device malfunction preventive circuit S as described later. It is not necessarily limited to a specific kind of device.

A PLD (Programmable Logic Device) 50 is used as the semiconductor device provided with the semiconductor device malfunction preventive circuit S in the electronic device 100 according to the embodiment of the present invention.

This PLD 50 is basically the same as a PLD having a conventionally and generally known structure except that it is provided with the semiconductor device malfunction preventive circuit S therein.

More specifically, the PLD 50 is mainly composed of a section called a macrocell logic cell 1 in which a desired logic circuit can be configured and a section called an input/output cell 2 for distributing a signal generated in the macrocell logic cell 1 and a signal inputted to the macrocell logic cell 1 from an external part.

Figure 1:
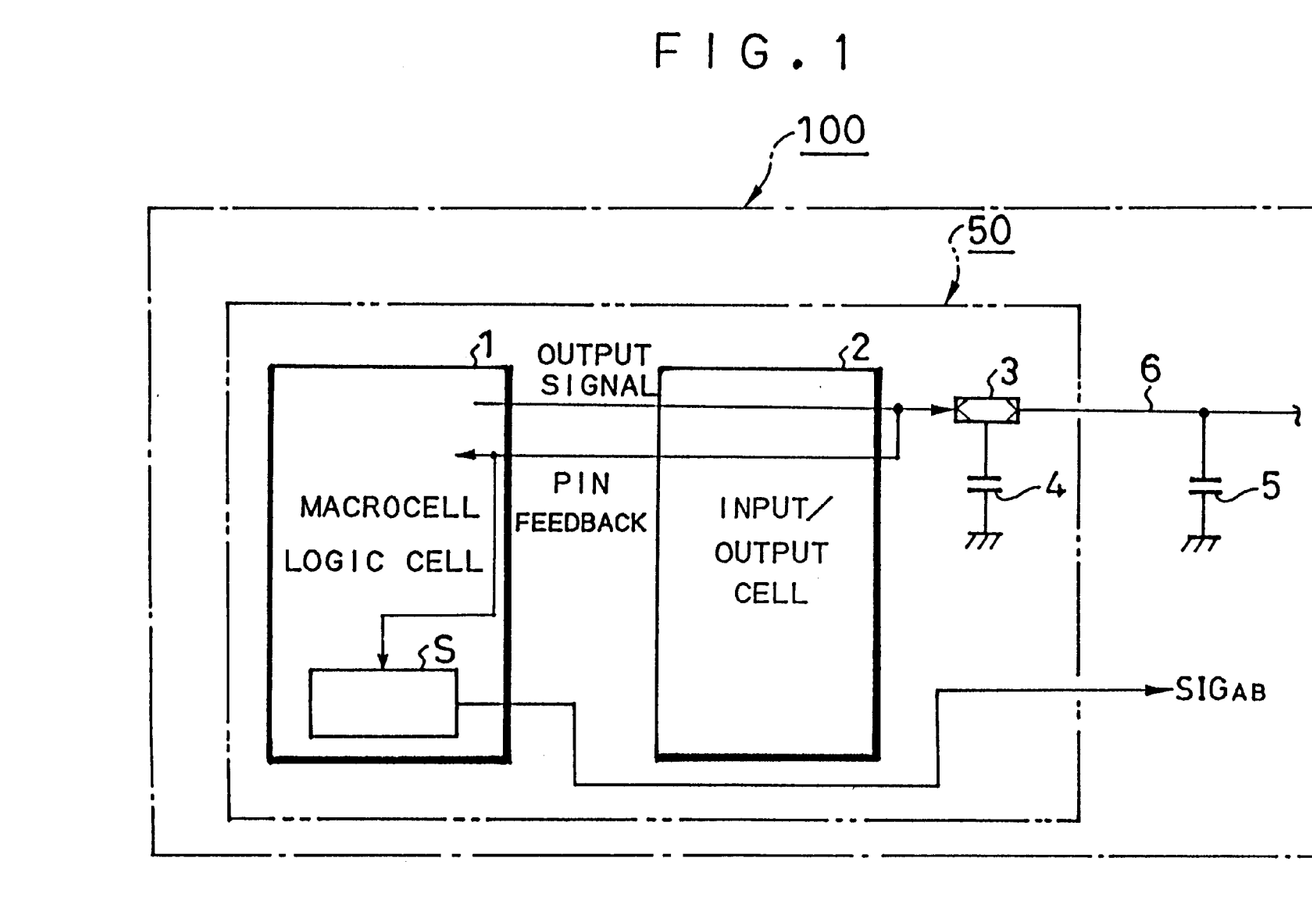
FIG. 1 is a block diagram showing a configuration example of an electronic device provided with a semiconductor device malfunction preventive circuit in an embodiment of the present invention.

In FIG. 1, the macrocell logic cell 1 outputs various signals, for instance, any on of a reset signal for the electronic device 100 and a control signal to be needed outside to control the generation of the reset signal. Any one of them is outputted to the external part of the PLD 50 via the output pin 3. The PLD 50 of course has a plurality of output pins which are not shown, but other output pins are omitted here in order to simplify the drawing and make the explanation easy to understand.

Generally, an output signal in a PLD is outputted to an external part and is returned to a macrocell logic cell as a so-called feedback signal called a pin-feedback. This is because there is a demand that the output signal is required for the generation and so on of a logic signal in the macrocell logic cell.

A part of the signal outputted to the output pin 3 in the embodiment of the present invention is also returned to the macrocell logic cell 1 as a pin feedback (refer to FIG. 1).

A first capacitor 4 as a time constant circuit is connected between the output pin 3 and the ground, and outside this PLD 50, a second capacitor 5 similarly as a time constant circuit is connected between the ground and an appropriate place of a signal line 6 which connects the output pin 3 to a not-shown circuit portion inside the electronic device 100.

Incidentally, the signal line 6 preferably uses, for example, so-called print pattern wiring, but it is not of course necessarily limited to this.

It is also preferable that the capacity values of the first and second capacitors 4, 5 are set at values appropriate for removing, especially an external impulse noise among external noises including especially, an ESD pulse.

Meanwhile, the macrocell logic cell 1 has the semiconductor device malfunction preventive circuit S provided therein. This semiconductor device malfunction preventive circuit S is structured to use, for example, a logic element of the macrocell logic cell 1.

A pin feedback signal from the output pin 3 is inputted to this semiconductor device malfunction preventive circuit S.

The semiconductor device malfunction preventive circuit S is structured to monitor the signal output state in the output pin 3, and to output an abnormality detecting signal $SIG_{AB}$, for example, with the logical value of High (or the logical value of Low) when a predetermined state is judged to be detected.

When the signal outputted from the output pin 3 is the reset signal of the electronic device 100 or the control signal used for controlling the generation of the reset signal, the abnormality detecting signal $SIG_{AB}$ is not required to be outputted to the external part of the PLD 50, but it is only required to have the regular reset signal for resetting the abnormal state outputted to the electronic device 100 via the output pin 3 at an instant when the abnormality detecting signal $SIG_{AB}$ is generated.

When the signal outputted via the output pin 3 is not either the above-mentioned reset signal for the electronic device 100 or the control signal to use for controlling the generation of the reset signal, it is preferable that the wiring is so structured that the abnormality detecting signal $SIG_{AB}$ is outputted to the external part of the PLD 50 as shown in FIG. 1 and inputted to a not-shown circuit portion necessary for resetting when the semiconductor device malfunction preventive circuit S detects an improper operation due to an external noise on this signal.

Note that the semiconductor device malfunction preventive circuit S not only detects a signal abnormality in the output pin 3 due to the external noise invading the PLD 50, but also it can of course detect a signal abnormality in the signal line 6 due to an external noise directly invading the signal line 6, an external noise invading another circuit portion and transmitting through the signal line 6, or the like. This is because, when the signal abnormality occurs- in the signal line 6, this abnormality is naturally inputted to the semiconductor device malfunction preventive circuit S as the pin feedback signal via the output pin 3.

Therefore, it can be said that the semiconductor device malfunction preventive circuit S according to the embodiment of the present invention also operates effectively when the signal observed in the output pin 3 or the signal line 6 becomes abnormal due to the external noise invading the signal line 6 though the PLD 50 itself operates normally and is in an operation state in which a predetermined signal is outputted to the output pin 3.

Furthermore, in the above-described structure, the first and second capacitors 4, 5 remove the external noise to prevent the signal from the output pin 3 from becoming abnormal instantly due to the external noise. Moreover, when the signal in the output pin 3 or the signal in the signal line 6 becomes abnormal, the semiconductor device malfunction preventive circuit S detects this abnormality to reset the operation of the electronic device 100. Therefore, it can be expected that the multiplier effect of suppressing the external noise is brought about by the first and second capacitors 4, 5 and the semiconductor device malfunction preventive circuit S.

Next, a concrete example of the circuit configuration of the semiconductor device malfunction preventive circuit S will be explained with reference to FIG. 2.

This concrete example of the circuit configuration is composed of four D-type flip-flops 7 to 10 and a judging section 32.

First, a signal to be monitored, namely, a part of the signal obtained in the output pin 3 is inputted to the sampling section 31 as the pin feedback signal in the embodiment of the present invention. The sampling section 31 samples this signal at a predetermined cycle and outputs the sampling result.

Figure 2:
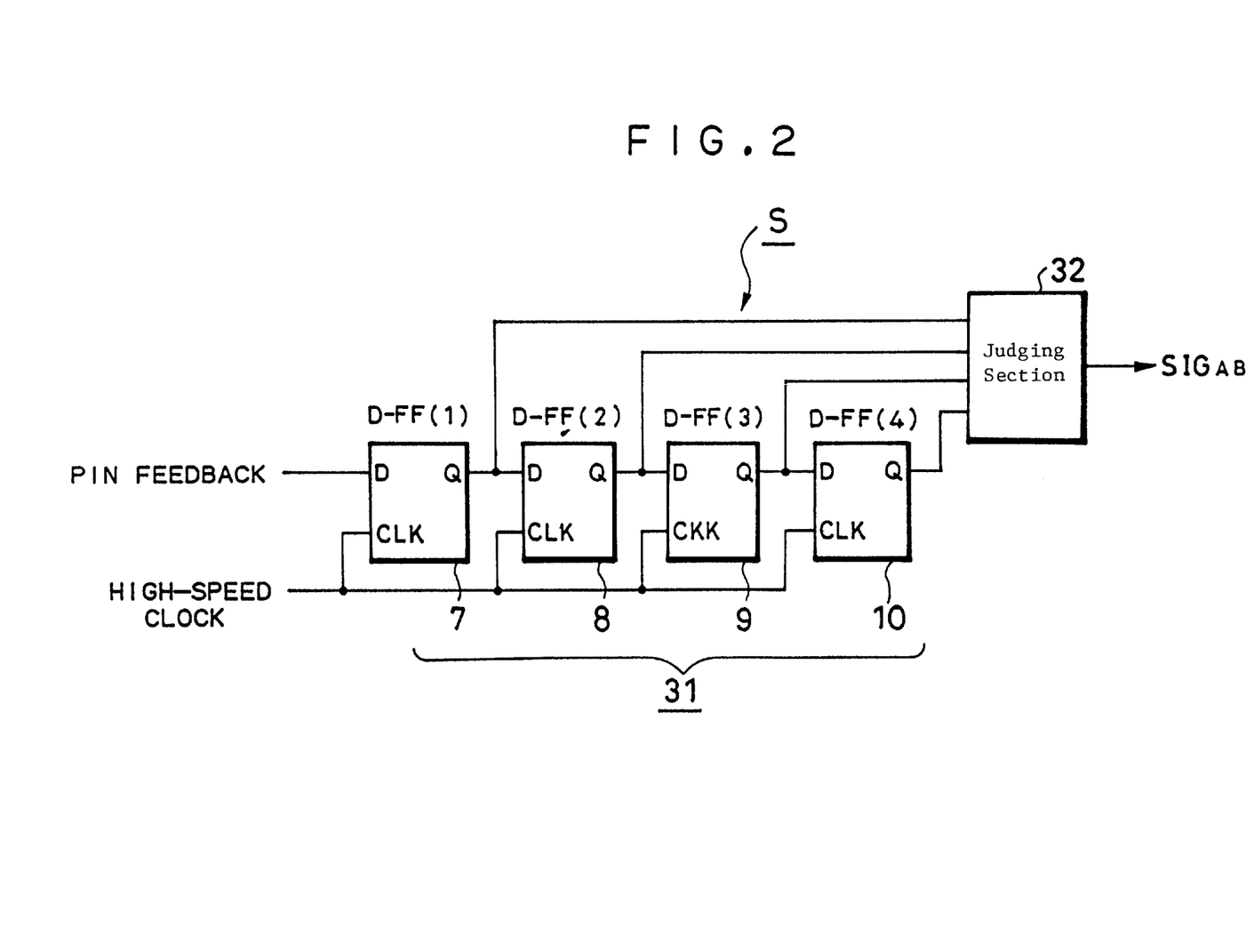
FIG. 2 is a circuit diagram showing a concrete example of a circuit configuration of the semiconductor device malfunction preventive circuit in the embodiment of the present invention.

Specifically, in the sampling section 31 in the embodiment of the present invention, the pin feedback signal and a high-speed clock are first applied to a D-input terminal and a clock input terminal (denoted by 'CLK' in FIG. 2) of the first D-type flip-flop (denoted by 'D-FF(1)' in FIG. 2) 7, respectively. Here, it is theoretically sufficient that the high-speed clock has a frequency twice as high as that of the pin feedback signal or higher, according to a sampling theorem. However, in an actual practice, it is preferable that the high-speed clock has a frequency approximately 10 times as high as that of the pin feedback signal or higher. This high-speed clock is generated in a not-shown circuit portion inside the macrocell logic cell 1 or generated outside the PLD 50.

A Q-output terminal of this first D-type flip-flop 7 is connected to a D-input terminal of the second D-type flip-flop (denoted by 'D-FF(2)' in FIG. 2) 8 and connected to an input stage of the judging section 32.

A Q-output terminal of the second D-type flip-flop 8 is connected to a D-input terminal of the third D-type flip-flop (denoted by 'D-FF(3)' in FIG. 2) 9 and connected to the input stage of the judging section 32.

A Q-output terminal of the third D-type flip-flop 9 is connected to a D-input terminal of the fourth D-type flip-flop (denoted by 'D-FF(4)' in FIG. 2) 10 and connected to the input stage of the judging section 32.

Incidentally, the high-speed clock is inputted to clock input terminals of the second to fourth D-type flip-flops 8 to 10 (all of them are denoted by 'CLK' in FIG. 2), similarly to the first D-type flip-flop 7.

The judging section 32 is structured to judge that abnormality exists to output the abnormality detecting signal $SIG_{AB}$ when the sampling result of the sampling section 31 is in a predetermined state.

As a concrete structure example of the above-described judging section 32, in the case, for example, where the sampling section 31 has the configuration previously described, it is preferable that its logical circuit is so structured that the signal of the output pin 3 is judged to be abnormal and the abnormality detecting signal $SIG_{AB}$ is outputted when the logical values Low are inputted from any of three of the four Q-outputs of the first to fourth D-type flip-flops 7 to 10.

It should be noted that the above structure example of the logic circuit is only one example, and the logic circuit is not of course necessarily limited to this structure. It should be set freely in view of an occurrence frequency of noises, the operational characteristic of the electronic device, and so on how many Q-outputs among the four Q-outputs should output the logical values Low in order to make the abnormality judgment. Moreover, the sampling section 31 is not of course necessarily limited to the configuration composed of the four D-type flip-flops 7 to 10 as described above, either. Various circuit configurations are applicable according to desired sampling forms.

Furthermore, the structure of the logic circuit using a so-called logic element is not necessarily applied to the sampling section 31 and the judging section 32, namely, the semiconductor device malfunction preventive circuit-S. It may also be structured, for example, to make the abnormality judgment of the signal inputted from the pin feedback signal by using a microprocessor represented by a DSP (Digital Signal Processor) or the like which is structured to be able to execute a high-speed digital processing.

As described hitherto, according to the present invention, a semiconductor device malfunction preventive circuit is configured inside a semiconductor device, the semiconductor device malfunction preventive circuit outputting a signal for resetting the operation of an electronic device using this semiconductor device immediately after a signal abnormality occurrence is detected in an output pin of the semiconductor device or in an external signal line connected thereto due to an external noise. Consequently, it is surely suppressed that a malfunction of the semiconductor device causes a malfunction of the electronic device using this semiconductor device to continue, thereby bringing the electronic device into an uncontrollable state in the worst case to give damages and so on to the electronic device. As a result, the effect that operational reliability can be enhanced is brought about.

What is claimed is:

1. A semiconductor device malfunction preventive circuit which is disposed inside a programmable logic device semiconductor device, wherein the semiconductor device malfunction preventive circuit has a structure of periodically sampling a pin feedback signal inputted as an input signal from the programmable logic device, and outputting an abnormality detecting signal when a number of changes to a predetermined logical value based on the input signal meets a predetermined number.

2. A semiconductor device malfunction preventive circuit according to claim 1, wherein the programmable logic device includes a macrocell logic cell and an output pin connected to the macrocell logic, and the pin feedback signal is the signal to which an output signal outputting from the macrocell logic cell branches off at the output pin and returns.

3. A semiconductor device malfunction preventive circuit according to claim 2, wherein the semiconductor device malfunction preventive circuit is structured by using a logic element of the macrocell logic cell.

4. A semiconductor device malfunction preventive circuit according to claim 3, wherein the semiconductor device malfunction preventive circuit includes a sampling section and a judging section, the sampling section periodically samples the pin feedback signal inputted as an input signal and outputs a predetermined logical value corresponding to the input signal, and the judging section outputs the abnormality detecting signal when the judging section detects that a number of changes to a predetermined logical value meets a predetermined number.

5. A semiconductor device malfunction preventive circuit according to claim 4, wherein the sampling section has a plurality of D-type flip-flops to which high speed clock is inputted from an external part, each of the D-type flip-flops is connected in form of cascade connection, so that the pin feedback signal is inputted to the first D-type flip-flop, a Q-output terminal of the first D-type flip-flop is connected to an D-input terminal of a next D-type flip-flop and a Q-output terminal of the next D-type flip-flop is connected to an D-input terminal of a further next D-type flip-flop, the Q-output terminal of each of the D-type flip-flops is connected to the judging section respectively, and the judging section outputs the abnormality detecting signal when the judging section detects that logical values of the predetermined number of Q-output terminals among the plurality of D-type flip-flop meet the predetermined logical value.

6. A semiconductor device malfunction preventive circuit according to claim 5, wherein a first capacitor is connected between the output pin which the feedback signal branches and the ground, the first capacitor has a predetermined capacity values for removing external impulse noise.

7. A semiconductor device malfunction preventive circuit according to claim 6, wherein a signal line to an external portion is connected to the output pin, a second capacitor is connected between the signal line and the ground, and the second capacitor has a predetermined capacity values for removing external impulse noise.

8. An electronic device having a programmable logic device, wherein the programmable logic device includes a sampling section and a judging section, the sampling section has a plurality of D-type flip-flops to which high speed clock is inputted from an external part, each of the D-type flip-flops is connected in form of cascade connection, so that pin feedback signal from the output pin of the programmable logic device is inputted to the first D-type flip-flop, a Q-output terminal of the first D-type flip-flop is connected to an D-input terminal of a next D-type flip-flop and a Q-output terminal of the next D-type flip-flop is connected to an D-input terminal of a further next D-type flip-flop, the Q-output terminal of each of the D-type flip-flops is connected to the judging section respectively, and the judging section outputs an abnormality detecting signal when the judging section detects that logical values of the predetermined number of the Q-output terminals among the plurality of D-type flip-flop meet the predetermined logical value.

9. An electronic device according to claim 8, wherein a first capacitor is connected between the output pin which the feedback signal branches and the ground, the first capacitor has a predetermined capacity values for removing external impulse noise.

10. An electronic device according to claim 9, wherein a signal line to an external portion is connected to the output pin, a second capacitor is connected between the signal line and the ground, and the second capacitor has a predetermined capacity values for removing external impulse noise.

* * * * *